(12) United States Patent
Nagata

(10) Patent No.: US 11,342,450 B2
(45) Date of Patent: May 24, 2022

(54) SEMICONDUCTOR DEVICE HAVING INJECTION ENHANCED TYPE INSULATED GATE BIPOLAR TRANSISTOR WITH TRENCH EMITTER AND METHOD OF MANUFACTURING THE SAME

(71) Applicant: RENESAS ELECTRONICS CORPORATION, Tokyo (JP)

(72) Inventor: Nao Nagata, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 37 days.

(21) Appl. No.: 16/702,188

(22) Filed: Dec. 3, 2019

(65) Prior Publication Data
US 2020/0212209 A1 Jul. 2, 2020

(30) Foreign Application Priority Data
Dec. 26, 2018 (JP) .............................. JP2018-243176

(51) Int. Cl.
*H01L 29/739* (2006.01)
*H01L 29/423* (2006.01)
(Continued)

(52) U.S. Cl.
CPC ...... *H01L 29/7397* (2013.01); *H01L 21/3065* (2013.01); *H01L 21/3081* (2013.01);
(Continued)

(58) Field of Classification Search
CPC ............. H01L 29/7397; H01L 29/0804; H01L 29/4236; H01L 29/41708; H01L 21/3065;
(Continued)

(56) References Cited

U.S. PATENT DOCUMENTS 9,842,919 B2  12/2017  Matsuura
10,319,808 B2  6/2019  Naito
(Continued)

FOREIGN PATENT DOCUMENTS

JP  2017-157733 A  9/2017
JP  2018-046053 A  3/2018
JP  2018-182279 A  11/2018

OTHER PUBLICATIONS

Japanese Notice of Reasons for Refusal issued in corresponding Japanese Patent Application No. 2018-243176, dated Mar. 22, 2022, with English translation.

*Primary Examiner* — Robert T Huber
(74) *Attorney, Agent, or Firm* — McDermott Will & Emery LLP

(57) ABSTRACT

A semiconductor device having an IE-type IGBT structure comprises a stripe-shaped trench gate and a stripe-shaped trench emitter arranged to face the trench gate formed in a semiconductor substrate. The semiconductor device further comprises an N-type emitter layer and a P-type base layer both surrounded by the trench gate and the trench emitter formed in the semiconductor substrate. The semiconductor device also comprises a P-type base contact layer arranged on one side of the trench emitter and formed in the semiconductor substrate. The p-type base contact layer, the emitter layer, and the trench emitter are commonly connected with an emitter electrode. The trench emitter is formed deeper than the trench gate in a thickness direction of the semiconductor substrate.

4 Claims, 15 Drawing Sheets

(51) Int. Cl.
  *H01L 29/08* (2006.01)
  *H01L 29/10* (2006.01)
  *H01L 29/417* (2006.01)
  *H01L 29/66* (2006.01)
  *H01L 29/49* (2006.01)
  *H01L 21/308* (2006.01)
  *H01L 21/3065* (2006.01)

(52) U.S. Cl.
  CPC ...... *H01L 29/0804* (2013.01); *H01L 29/0821* (2013.01); *H01L 29/1004* (2013.01); *H01L 29/1095* (2013.01); *H01L 29/41708* (2013.01); *H01L 29/4236* (2013.01); *H01L 29/42304* (2013.01); *H01L 29/4916* (2013.01); *H01L 29/6634* (2013.01); *H01L 29/66348* (2013.01)

(58) Field of Classification Search
  CPC ............. H01L 21/3081; H01L 29/0821; H01L 29/1004; H01L 29/1095; H01L 29/42304; H01L 29/4916; H01L 29/6634; H01L 29/66348
  USPC .................................................. 257/144, 578
  See application file for complete search history.

(56) References Cited

U.S. PATENT DOCUMENTS

| | | |
|---|---|---|
| 10,600,896 B2 | 3/2020 | Matsuo et al. |
| 2011/0018029 A1* | 1/2011 | Pfirsch ............... H01L 29/0619 257/147 |
| 2017/0025522 A1* | 1/2017 | Naito .................. H01L 29/407 |

* cited by examiner

COMPARATIVE EXAMPLE

SEMICONDUCTOR DEVICE HAVING INJECTION ENHANCED TYPE INSULATED GATE BIPOLAR TRANSISTOR WITH TRENCH EMITTER AND METHOD OF MANUFACTURING THE SAME

CROSS-REFERENCE TO RELATED APPLICATIONS

The disclosure of Japanese Patent Application No. 2018-243176 filed on Dec. 26, 2018 including the specification, drawings and abstract is incorporated herein by reference in its entirety.

BACKGROUND OF THE INVENTION

The present invention relates to semiconductor device and its manufacturing method, and in particular, the present invention is a technique useful for application to an IE (Injection Enhanced) type IGBT (Insulated Gate Bipolar Transistor).

As an example of a structure of the IE type IGBT, the structure having a stripe-shaped trench gate formed so as to surround an N-type emitter layer and a P-type base layer in plan view, a P-type floating layer disposed outside the trench gate and formed so that one end thereof is in contact with the side surface of the trench gate, and an N-type hole barrier layer formed under the P-type base layer is known as Japanese Lead-open Patent Application No. 2017-157733 (Patent Document 1), for example.

Patent Document 1 discloses a structure having stripe-shaped trench emitters formed so as to be in contact with the other end of the P-type floating layer in order to provide a path for discharging holes accumulated in the P-type floating layer in order to suppress IGBT turn-off losses.☐

SUMMARY OF THE INVENTION

However, the semiconductor device disclosed in Patent Document 1 has a structure in which two N-type emitter layers are formed in regions surrounded by stripe-shaped trench gates so as to face each other, and a P-type base contact layer having a high impurity density is formed between the two N-type emitter layers. Therefore, from the viewpoint of process processing accuracy, it is difficult to narrow the distance between the stripe-shaped trench gates, and further improvement of the IE effect becomes difficult.

In addition, since the trench emitter is disposed in a region away from the trench gate via the P-type floating layer, a path for discharging holes becomes long. Therefore, there is a concern that a potential variation of the P-type floating layer is induced and a gate potential variation is caused. As a result, there is a concern that the switching loss at the time of turn-off becomes large.

Other concerns and novel features will become apparent from the description of the specification and drawings.

A semiconductor device according to one embodiment includes a stripe-shaped trench gate, a stripe-shaped trench emitter arranged to oppose the trench gate, an N-type emitter layer and a P-type base layer arranged on one side surface of the trench gate in a region surrounded by the trench gate and the trench emitter, and a P-type base contact layer arranged on one side of the trench emitter. Further, the p-type base contact layer and the trench emitter are commonly connected by an emitter electrode.

In the semiconductor device according to one embodiment, conduction losses can be reduced.

DETAILED DESCRIPTION OF THE EMBODIMENTS

Figure 1:
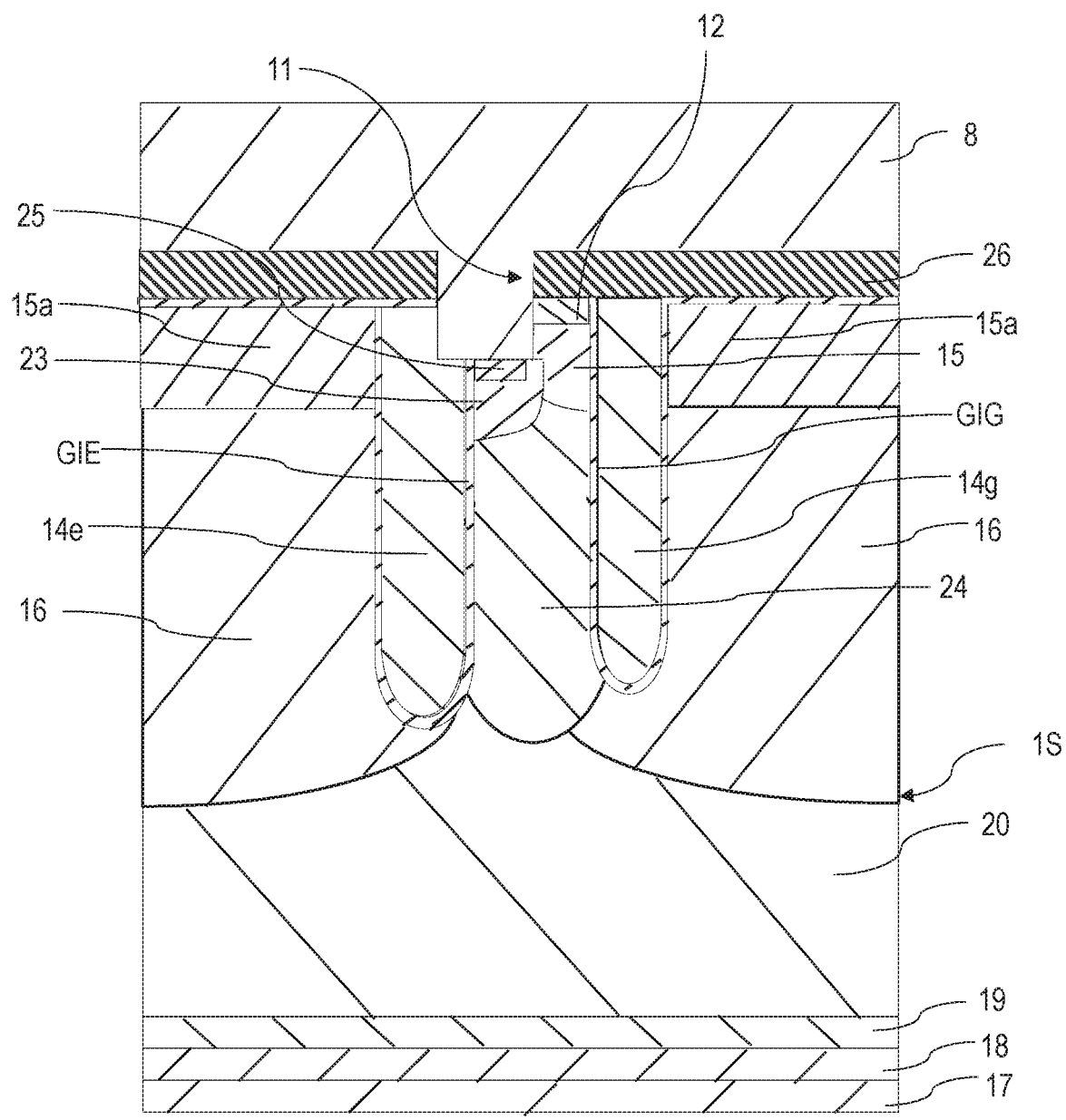
FIG. 1 is a main portion cross-sectional view of a semiconductor device according to one embodiment.

Hereinafter, a semiconductor device according to one embodiment will be described in detail by referring to the drawings. In the specification and the drawings, the same or corresponding form elements are denoted by the same reference numerals, and a repetitive description thereof is omitted. Also, at least some of the embodiments and each modification may be arbitrarily combined with each other.

Prior to describing one embodiment, an IE-type IGBT that is although not publicly known and is filed by the present inventor (Japanese Patent Application No. 2017-145400: filed on Jul. 27, 2017), will be described as a comparative example.

Figure 13:
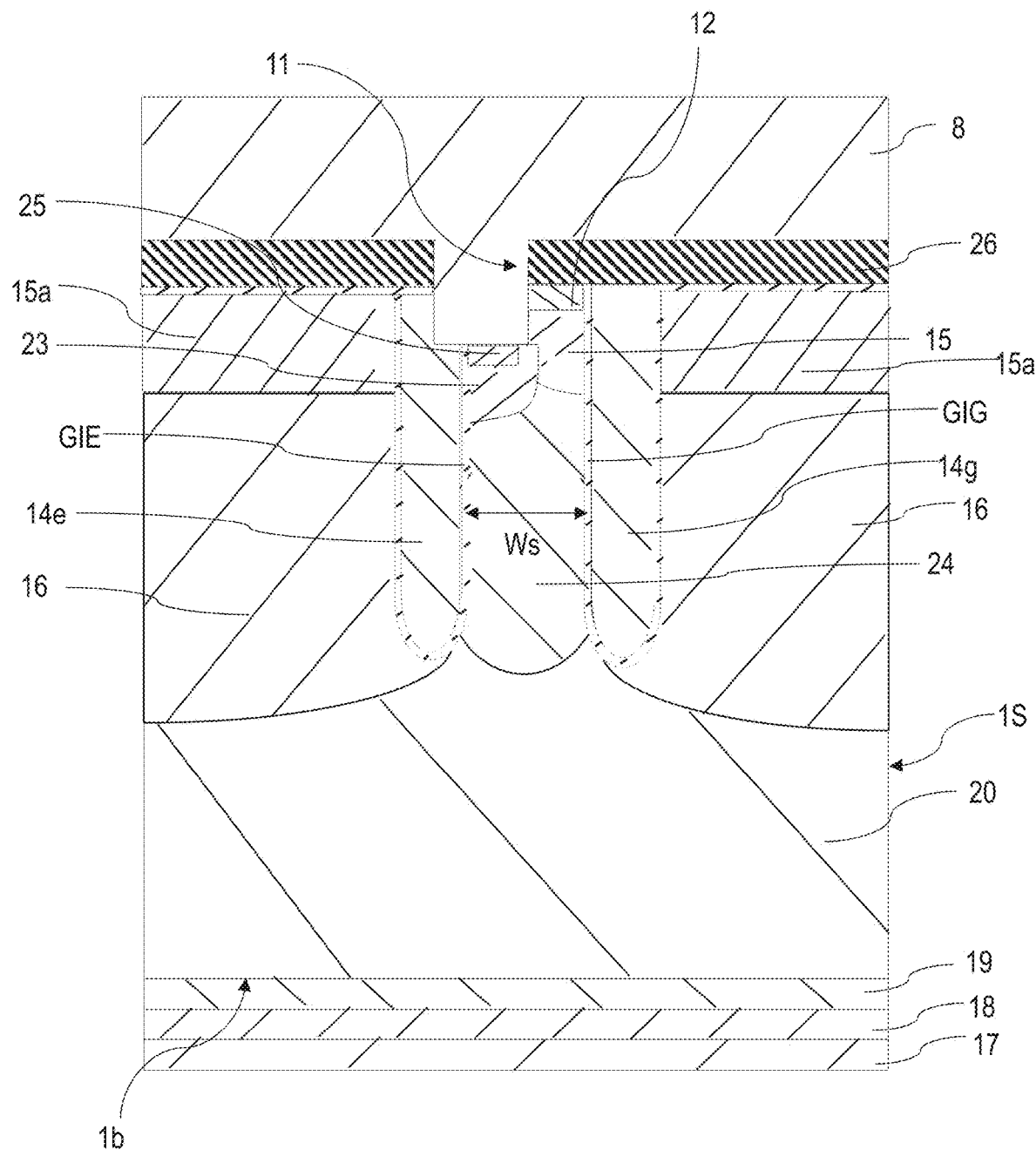
FIG. 13 is a main portion cross-sectional view showing a comparative example of the one embodiment shown in FIG. 1.

As shown in FIG. 13, the comparative IE-type IGBT includes a trench emitter 14e, a trench gate 14g, a P-type base layer 15, a P-type layer 15a, an N-type emitter layer 12, a P-type base contact layer 25, a P-type latch-up preventing layer 23, an N-type drift layer 20, an N-type hole barrier layer 24, an N-type buffering layer 19, a P-type collector layer 18, and a P-type floating layer 16. The trench emitters 14e and the trench gates 14g are formed on the main surface of the semiconductor substrate (semiconductor wafer) 1S so as to face each other. The P-type base layer 15 and the N-type emitter layer 12 are disposed on one side surface of the trench gate 14g via gate dielectric film GIGs. The P-type base contact layer 25 and the P-type latch-up preventing layer 23 have higher impurity concentrations than the P-type base layer 15, and are disposed on one side surface of the trench emitters 14e via gate dielectric film GIEs. The N-type hole barrier layer 24 is formed between the P-type base layer 15 and the N-type drift layer 20, and suppresses holes from reaching the P-type base layer 15 during operation of the IE-type IGBT. The P-type floating layer 16 is formed outside the trench emitter 14e and the trench emitter 14e.

The IE-type IGBT further includes a metal emitter electrode 8 commonly connected to the trench emitter 14e, the N-type emitter layer 12, the P-type base contact layer 25, and the P-type base layer 15 via the opening 11 of the interlayer insulating film 26, and a metal collector electrode 17 connected to the P-type collector layer 18.

In the IE-type IGBT shown in FIG. 13, the trench emitters 14e and the trench gates 14g are arranged adjacently facing each other, and the N-type emitter layers 12 are formed only on one side of the two trenches, so that the inter-trench distances Ws can be reduced.

Therefore, since the resistor to holes is increased, the hole accumulation effect is enhanced, and the IE effect can be improved.

Further, since the parasitic P-channel type MOSFET having the P-type floating layer 16, the P-type latch-up preventing layer 23, and the P-type base contact layer 25 as source/drain regions, the trench emitter 14e as a gate electrode, and the N-type hole barrier layer 24 as a channel forming region is disposed adjacently to the trench gate 14g, the holes accumulated in the P-type floating layer 16 at the time of turn-off are discharged to the emitter electrode 8 through the parasitic P-channel type MOSFET in a short path, whereby the switching time can be shortened. In addition, since the potential variation of the P-type floating layer 16 is suppressed, the potential of the trench gate 14g is stabilized, and the switching loss at the time of turn-off can be suppressed.

As a result of further examination of the IE-type IGBT shown in FIG. 13, the present inventors have found that electric field concentration occurs at the bottom of the trench gate 14g at the time of turn-off, hot carriers are generated due to generation of dynamic avalanche, and gate dielectric film GIGs may be damaged. For example, when the IE-type IGBT is switched at a potential of 600V and a gate voltage of −15V to +15V, if this dynamic avalanche occurs at the time of switching turn-off, the generated hot carriers are injected toward the trench gate 14g depending on the gate bias state, and the gate oxide film GIG may be deteriorated at the subsequent time, and the gate oxide film GIG may eventually be damaged.

Hereinafter, a semiconductor device having an IE-type IGBT will be described with reference to FIGS. 1 and 2.

In order to prevent or suppress the breakdown of the gate dielectric film GIGs described above, the present inventors have devised a novel structure in which the depth of the trench emitters 14e is formed deeper than the depth of the trench gates 14g, as shown in FIG. 1. According to this novel structure, the electric field is relatively concentrated on the bottom of the trench emitters 14e, and as a result, the concentration of the electric field at the bottom of the trench gates 14g can be alleviated, so that breakdown of the gate dielectric film GIGs can be suppressed.

On the other hand, since the bottom of the trench emitter 14e approaches the collector layer 18, there is a fear that the electric field concentrates on the bottom of the trench emitter 14e, but even if a dynamic avalanche occurs, the generated carriers are discharged to the emitter electrodes 8 via the P-type latch-up preventing layer 23 and the P-type base contact layer 25, so that breakdown of the gate dielectric film GIG and the gate dielectric film GIEs formed around the trench emitter 14e can be prevented.

In addition, since the length of the trench gate 14g is formed to be relatively shorter than the length of the trench emitter 14e, the P-type floating layer 16 has a structure that widely covers the bottom of the trench gate 14g, and thus the electric field concentration at the bottom of the trench gate 14g is further reduced.

Therefore, according to the configuration shown in FIG. 1, in the semiconductor device of the present embodiment, an IE type IGBT with high electric reliability can be supplied in addition to the improvement of the performance by the improvement of the IE effects.

Figure 2:
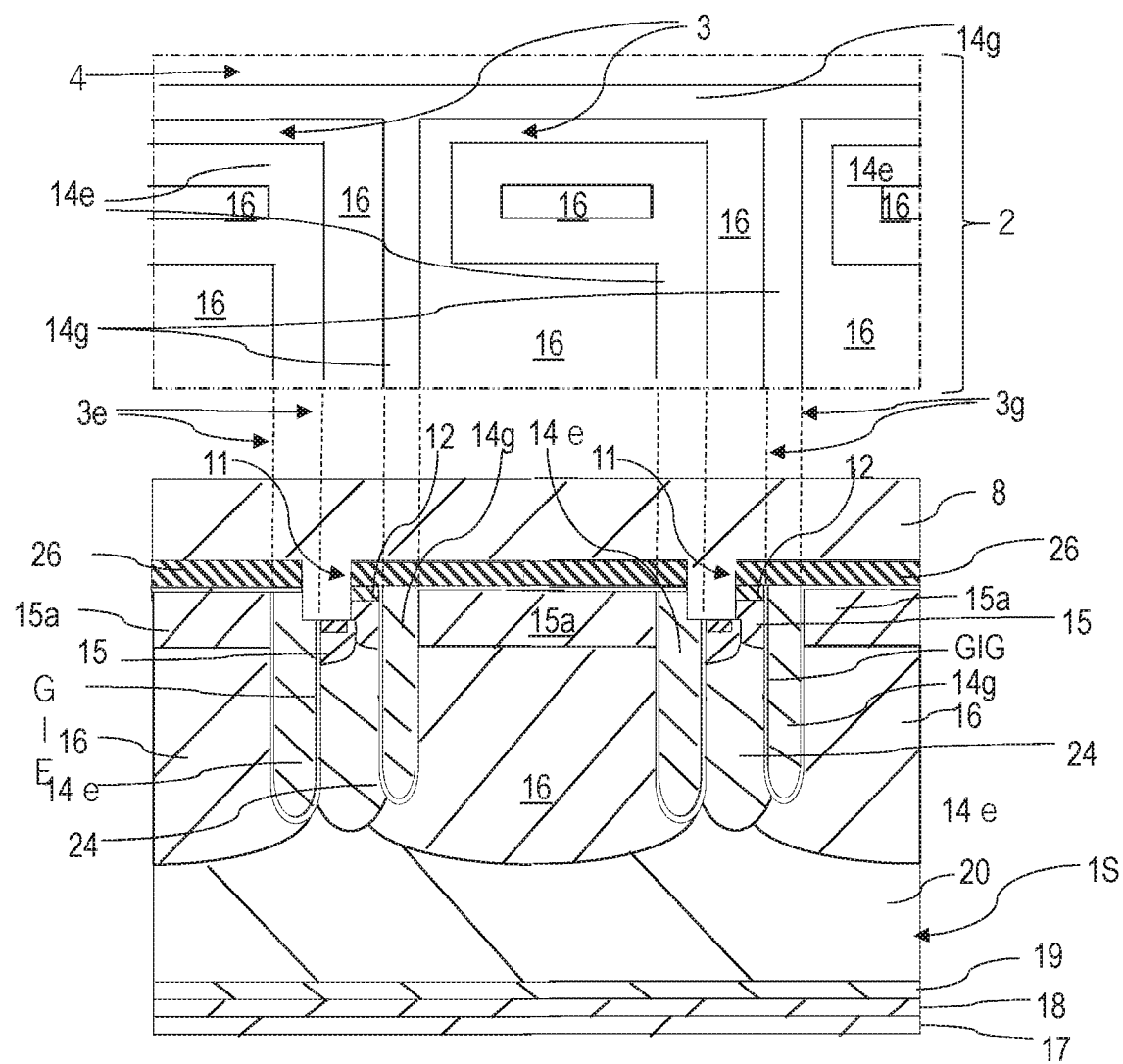
FIG. 2 is a main portion layout of the semiconductor device according to the one embodiment.

FIG. 2 shows an exemplary planar layout including trench emitters 14e and trench gates 14g of the IE-type IGBT shown in FIG. 1. The lower part of FIG. 2 is a cross-sectional view, and the upper part thereof is a plan view corresponding to the above-mentioned cross-sectional view, and the plan layout of the trench emitters 14e and the trench gates 14g is specifically shown in the plan view of FIG. 2. As shown in the figure, the trench emitter 14e and the trench gate 14g have stripe-shaped portions in plan view, and are arranged at predetermined intervals so as to face each other. Reference numeral 1S denotes a semiconductor substrate, reference numeral 17 denotes a collector electrode, reference numeral 20 denotes an N-type drift layer, and reference numeral 26 denotes an interlayer insulating film.

The trench emitter 14e is disposed in a region surrounded by the trench gate 14g in plan view. The P-type floating layer 16 is a region sandwiched between the trench emitter 14e and the trench gate 14g, and has the high resistance region 3 in which the base layer 15, the P-type layer 15a, and the emitter layer 12 are not formed. The P-type floating layer 16 and the emitter potential can be substantially electrically separated by the high resistance region 3. In the region 2, the region 4 located above the trench emitter 14e becomes the termination region of the IE-type IGBT, and the inside of the trench emitter 14e becomes the active cell region. Each of the reference numerals 3g, 3e is a lead line for associating a cross-sectional pattern of each of the trench gates 14g and the trench emitters 14e with a plane pattern.

The manufacturing method of the IE-type IGBT shown in FIG. 1 will be briefly described below.

Figure 3:
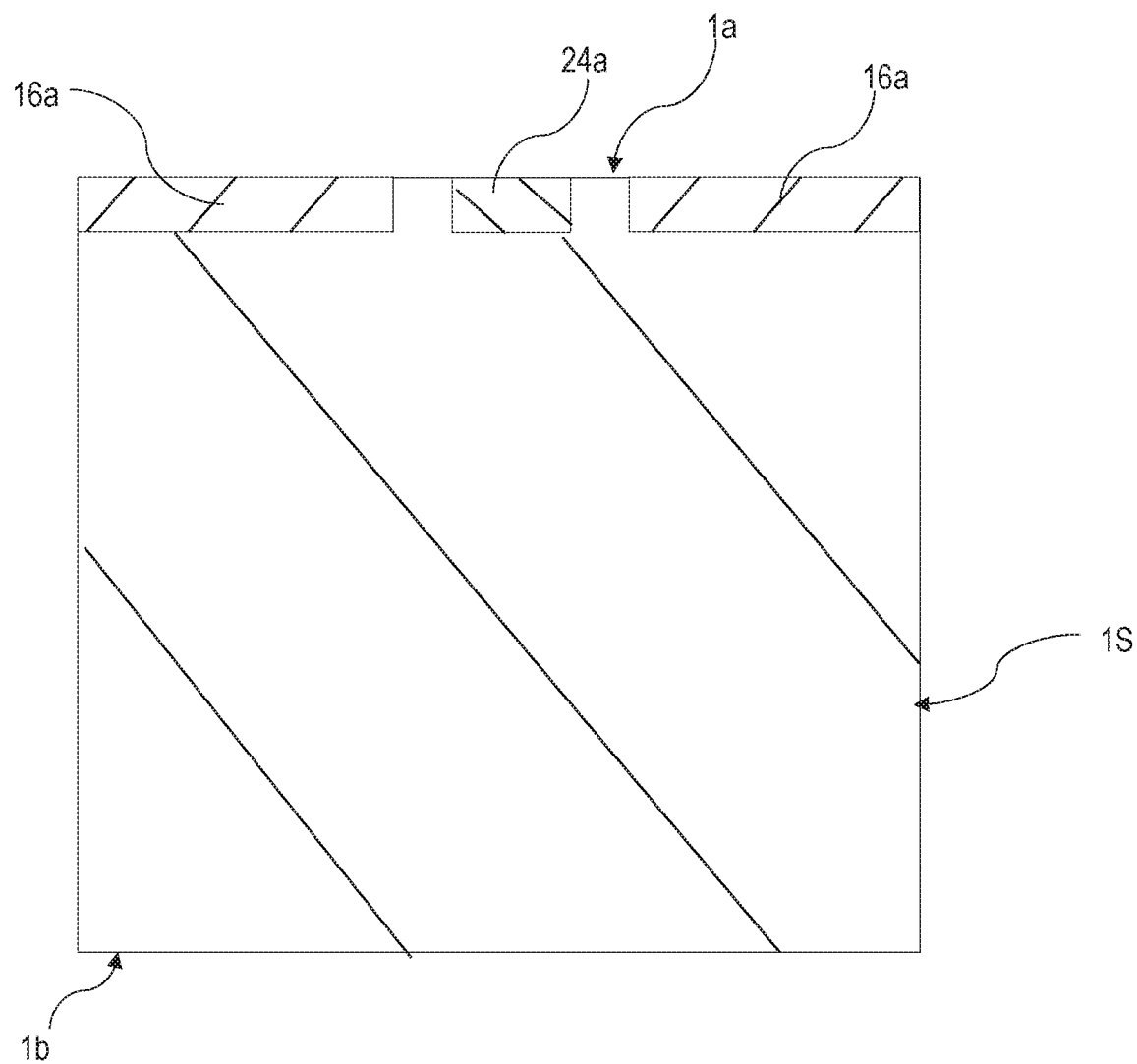
FIG. 3 is a main portion cross-sectional view for explaining a manufacturing method of the semiconductor device according to the one embodiment.

First, as shown in FIG. 3, a semiconductor substrate 1S of a silicon single crystal into which an N-type impurity such as phosphorus is introduced is prepared. The semiconductor substrate 1 S has a first main surface (front surface) 1a and a second main surface (back surface) 1b opposed to the first main surface 1a.

The impurity density of the N-type impurity in the semiconductor substrate 1 S is, for example, about $2 \times 10^{14}$ of $cm^{-3}$. The thickness of the semiconductor substrate 1 S is, for example, about 450 μm to 1,000 μm.

Next, an N-type impurity 24a for forming an N-type hole barrier layer 24 is introduced into the first main surface 1a of the semiconductor substrate 1S by ion implantation using the resist pattern as a mask. As the ion injection condition in this case, for example, it is possible to exemplify the ion injection condition in which the ion species is Phosphorus, the doze is about 6×10 12 cm−2, and the injection energy is about 200 keV as a preferred condition.

Next, a P-type impurity 16a for forming the P-type floating layer 16 is introduced into the first main surface 1a of the semiconductor substrate 1S by ion implantation using the resist pattern as a mask. As the ion implantation conditions at this time, for example, ion implantation conditions in which the ion species is boron, the dose is about 3.5×10 13, and the implantation energies are about 75 keV can be exemplified as suitable conditions.

Figure 4:
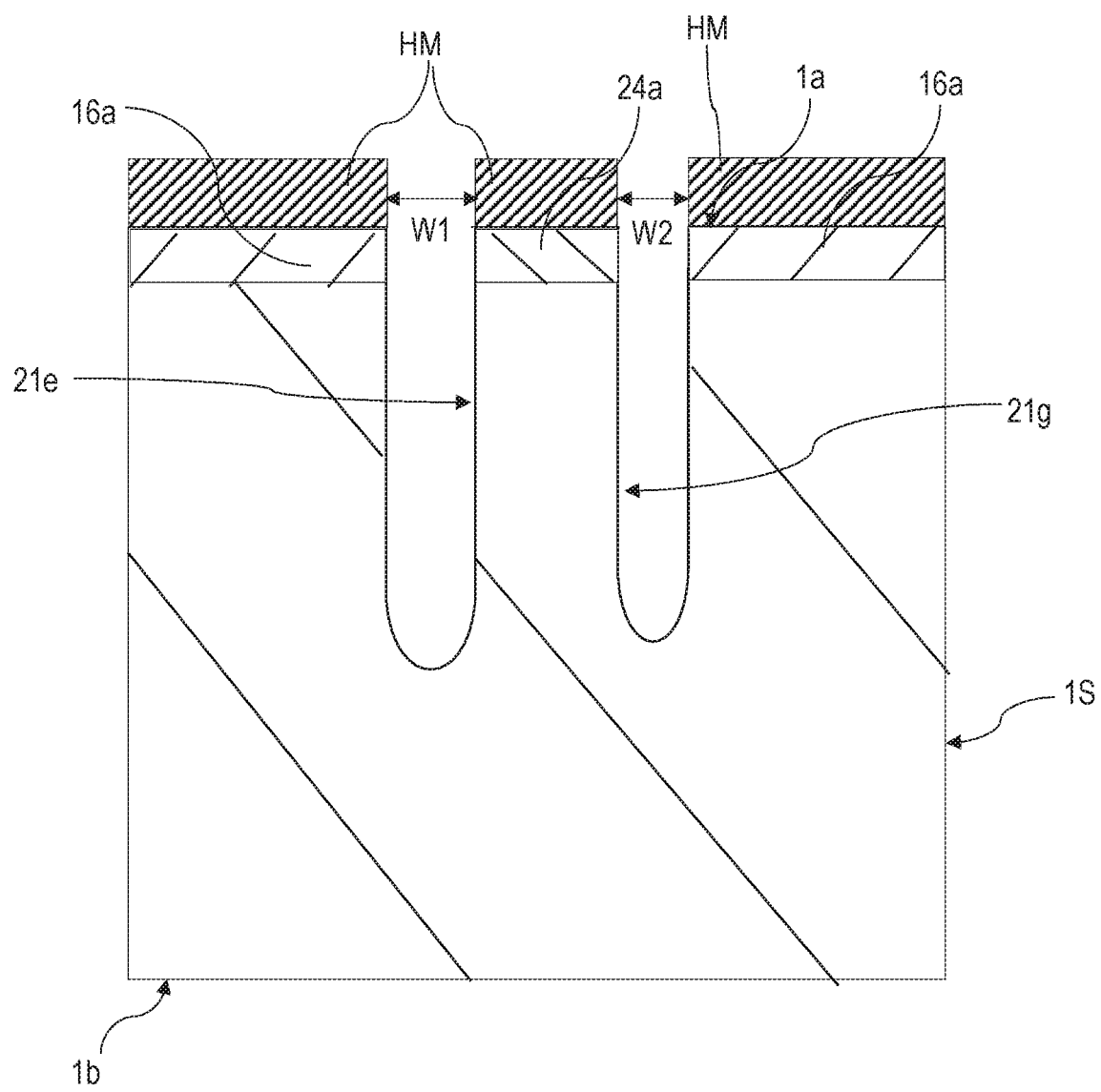
FIG. 4 is a main portion cross-sectional view for explaining the manufacturing method of the semiconductor device according to the one embodiment.

Next, as shown in FIG. 4, trenches (grooves) 21e and 21g are formed on the first main surface 1a of the semiconductor substrate 1S by etching using a hard mask (etching mask) HD made of a silicon oxide film, for example. Anisotropic dry etching is used for this etching, and as an etching gas, for example, a Cl2/O2 gas or a SF6/O2 gas can be exemplified as a suitable etching gas.

Figure 5:
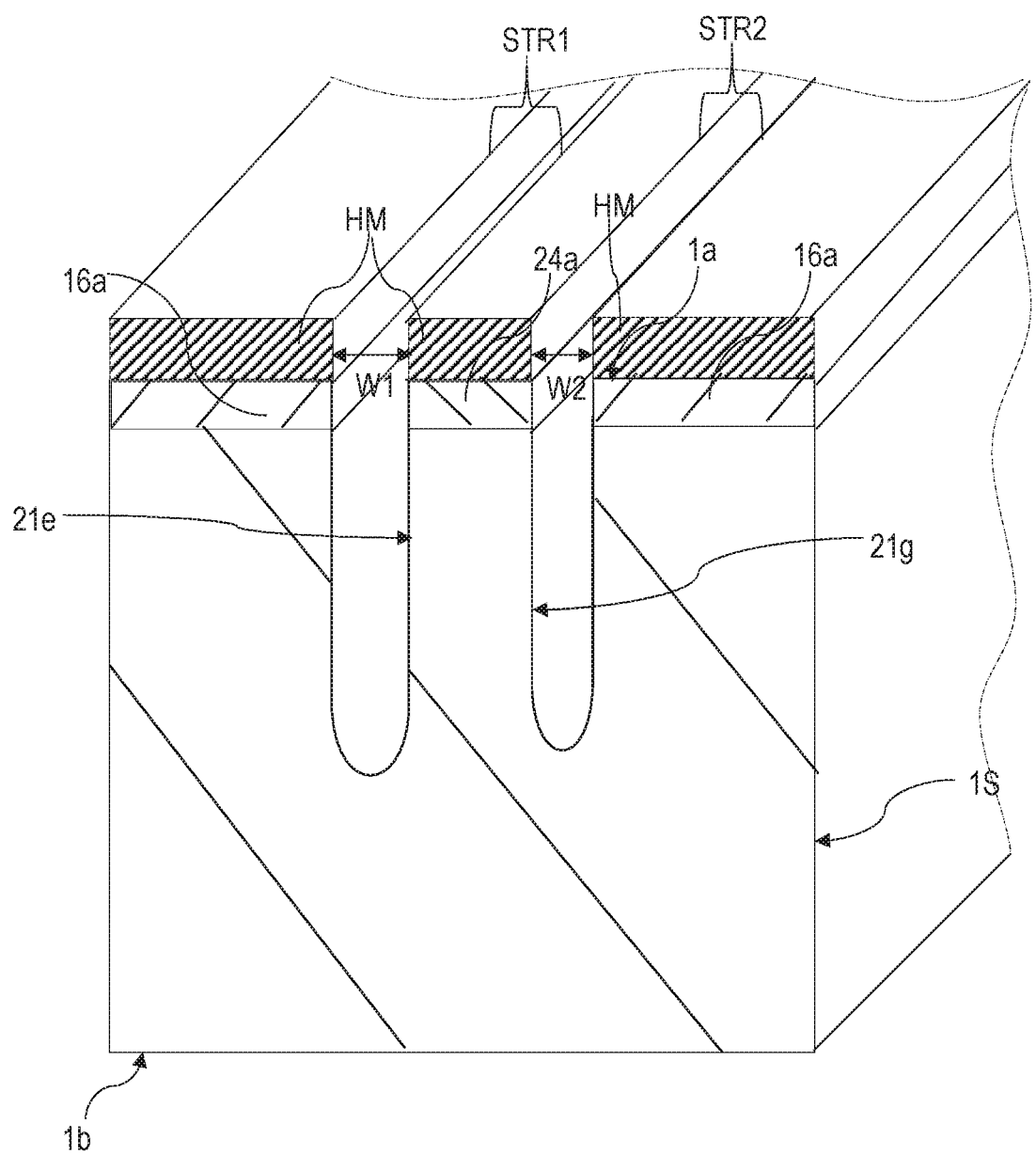
FIG. 5 is a main portion perspective view for explaining the manufacturing method of the semiconductor device according to the one embodiment.

As shown in FIG. 5, the hard mask HD is formed on the first main surface 1a of the semiconductor substrate 1S so as to define a stripe-shaped first region STR1 and a stripe-shaped second region STR2 arranged at predetermined intervals along the first region STR1.

Since the width W1 of the first region STR1 is wider than the width W2 of the second region STR2, when anisotropic dry etching is performed in the same process, the depth of the trench 21e is formed deeper than the depth of the trench 21g. The depths of the trenches 21e and 21g may be, for example, 0.5 μm and 0.4 μm as suitable values.

The width W1 and the width W2 may be, for example, 0.8 μm and 0.4 μm, respectively, as suitable values. Since the width of the first area STR1 is increased, the etching rate of the silicon is increased, and accordingly, the trench 21e is formed deeper. Therefore, trenches having different depths can be formed by etching in the same process.

Figure 6:
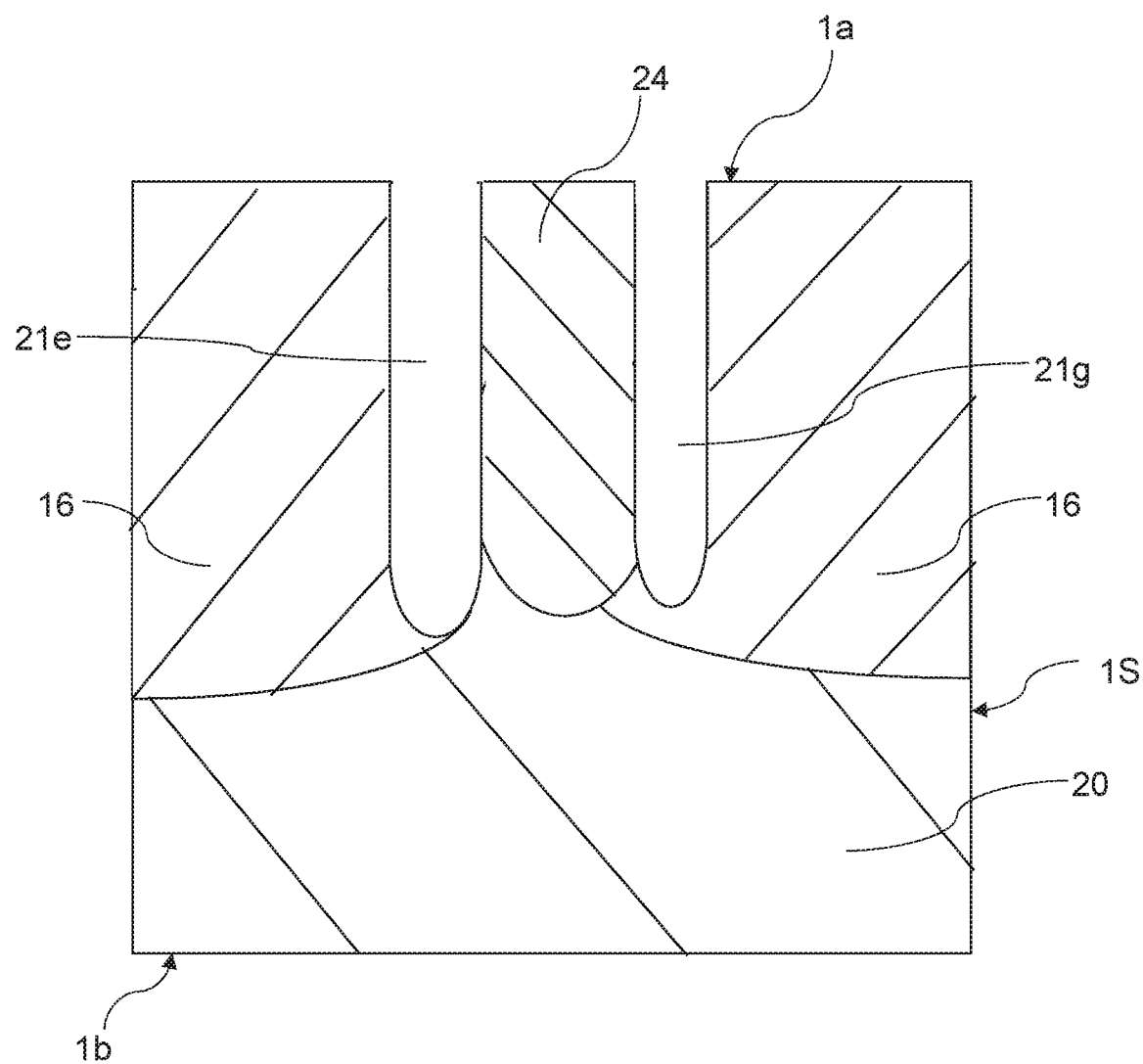
FIG. 6 is a main portion cross-sectional view for explaining the manufacturing method of the semiconductor device according to the one embodiment.

Next, as shown in FIG. 6, after the hard mask HD is removed, the N-type impurity 24a and the P-type impurity 16a are subjected to heat treatment at 1200° C. for about 30 minutes, for example, and extended diffuse is performed to form the P-type floating layer 16 and the N-type hole barrier layer 24. The hard mask HD may be removed after the heat treatment.

The ends of the P-type floating layer 16 are formed so as to cover the bottom surfaces of the trenches 21e and 21g. Since the depth of the trench 21g is shallow, the bottom surface portion of the trench 21g is covered with the P-type floating layer 16 in a thick structure. The thickness of the P-type floating layer 16 in the bottom surface portion of the trench 21g may be, for example, 0.5 μm as a suitable value.

In addition, regions of the N-type semiconductor substrate 1S remaining under the P-type floating layer 16 and the N-type hole barrier layer 24 during the stretching diffuse become the N-type drift layer 20.

The N-type hole barrier layer 24 formed between the trench 21e and the trench 21g suppresses holes from reaching the P-type base layer and being discharged during the operation of the IE-type IGBT, and functions as a barrier against holes. The impurity concentration of the N-type hole barrier layer 24 is set higher than the N-type impurity concentration in the N-type drift layer 20 and lower than the N-type impurity concentration of the N-type emitter layer 12 described later.

Figure 7:
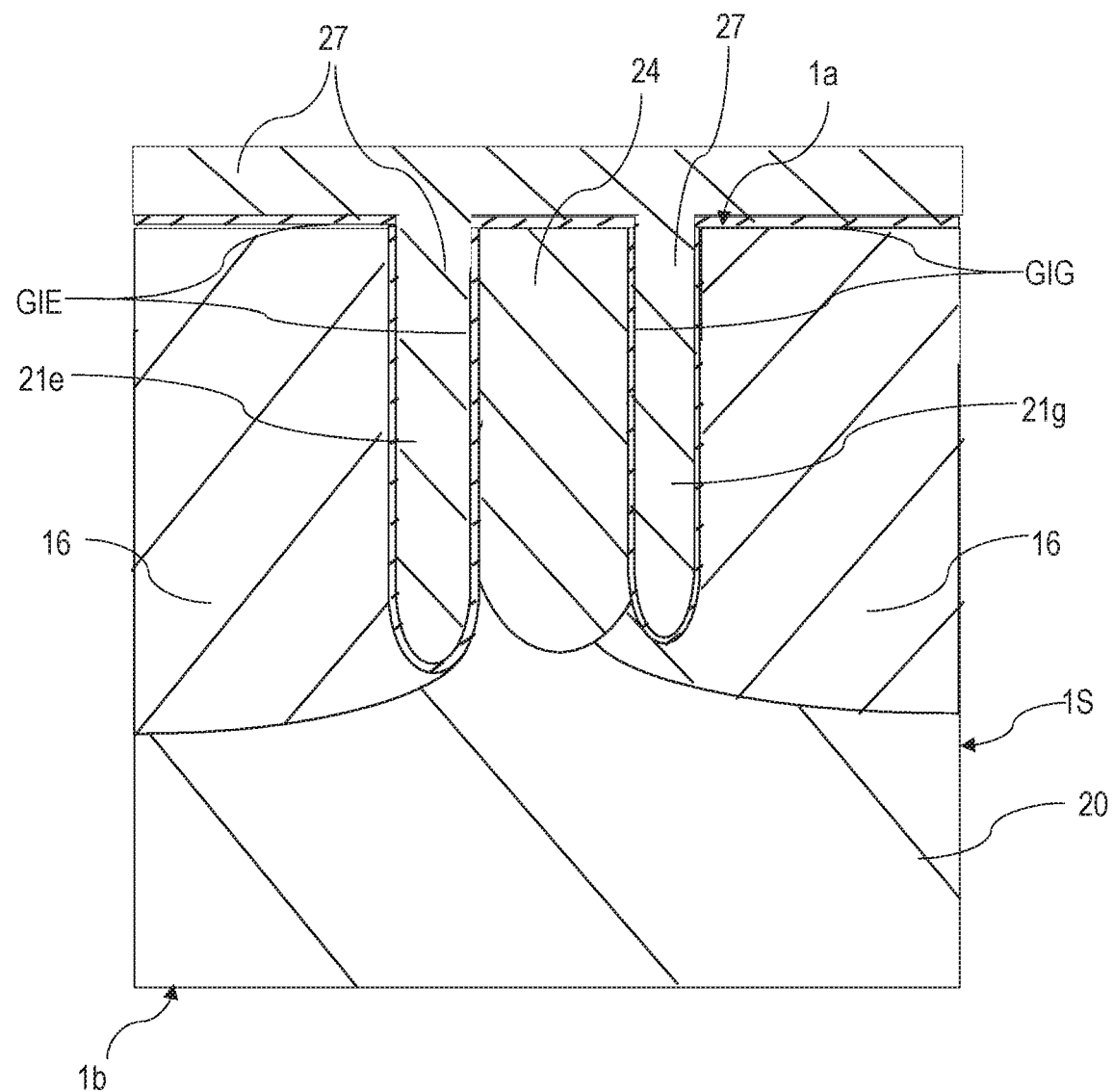
FIG. 7 is a main portion cross-sectional view for explaining the manufacturing method of the semiconductor device according to the one embodiment.

Next, as shown in FIG. 7, gate dielectric film GIEs and GIGs made of, e.g., silicon oxide films are formed on the inner walls of the trenches 21e and 21g by, e.g., thermal oxidation. The thickness of the gate dielectric film GIE/GIG is, for example, about 0.12 micrometers. The gate dielectric film GIEs and GIGs are also formed on the first main surface 1a of the semiconductor substrate 1S.

Next, a conductive film 27 made of a polysilicon film doped with phosphorus is formed on the main surface 1a of the semiconductor substrate 1S and inside the trenches 21e and 21g by, e.g., CVD (Chemical Vapor Deposition). The thickness of the conductive film 27 is, for example, about 0.5 μm to 1.5 μm.

Figure 8:
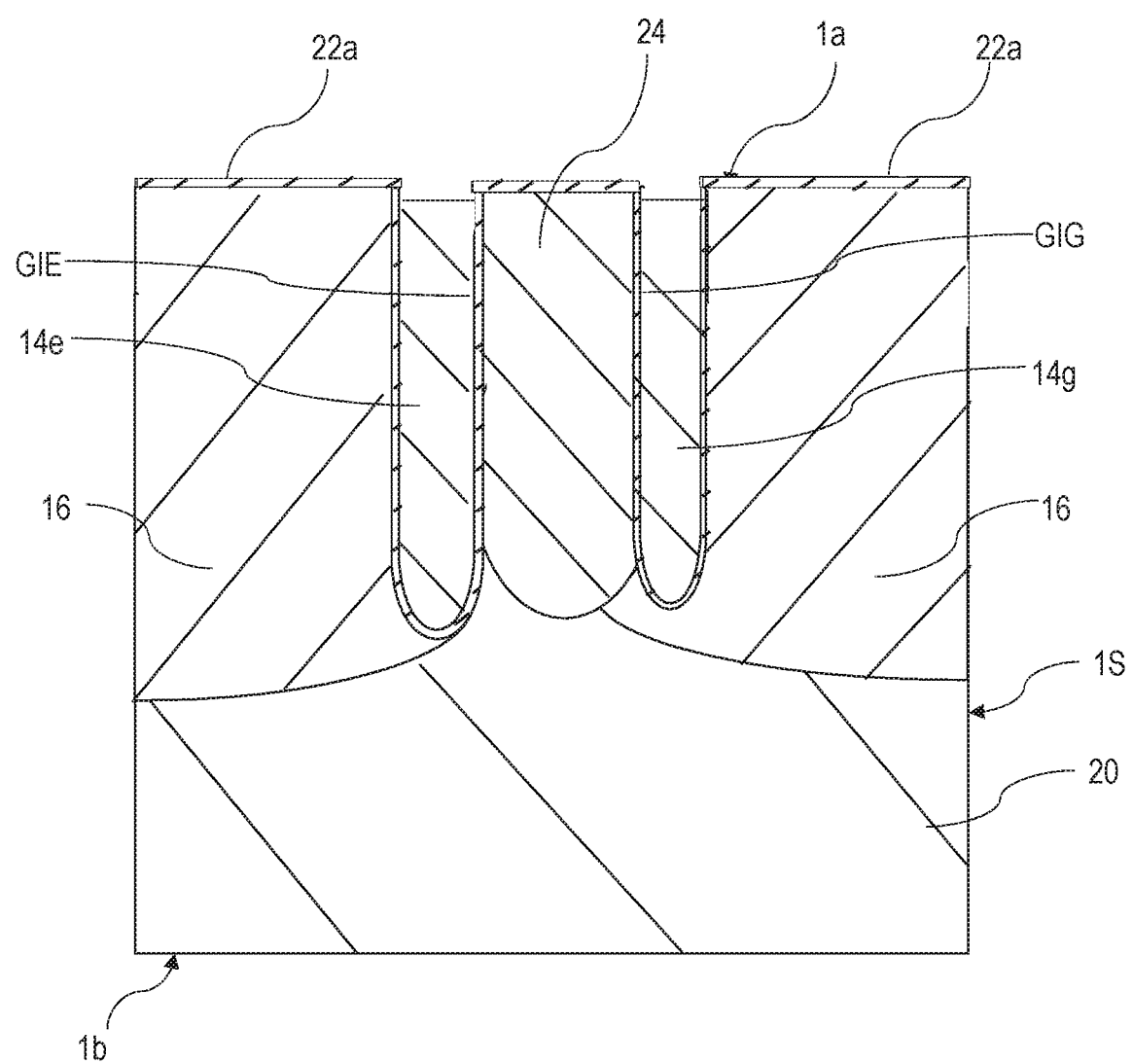
FIG. 8 is a main portion cross-sectional view for explaining the manufacturing method of the semiconductor device according to the one embodiment.

Next, as shown in FIG. 8, the conductive film 27 is etched back by, e.g., dry etching so that the conductive film 27 is buried in the trenches 21e and 21g on gate dielectric film GIEs and GIGs. As a gas for this dry etching, for example, a SF6/O2 gas can be exemplified as a suitable gas. Through this process, the trench emitter 14e and the trench gate 14g in which the conductive film 27 is processed are formed.

Next, gate dielectric film GIGs and GIEs other than the inside of the trenches 21g and 21e are removed by, e.g., dry-etching method.

Next, on the main surface 1a of the semiconductor substrate 1S, an insulating film 22a made of a silicon oxide film, which is relatively thin for subsequent ion implantation, and which is approximately the same as, for example, gate dielectric film GIG or GIE, is formed by, for example, thermal oxidation or CVD.

Figure 9:
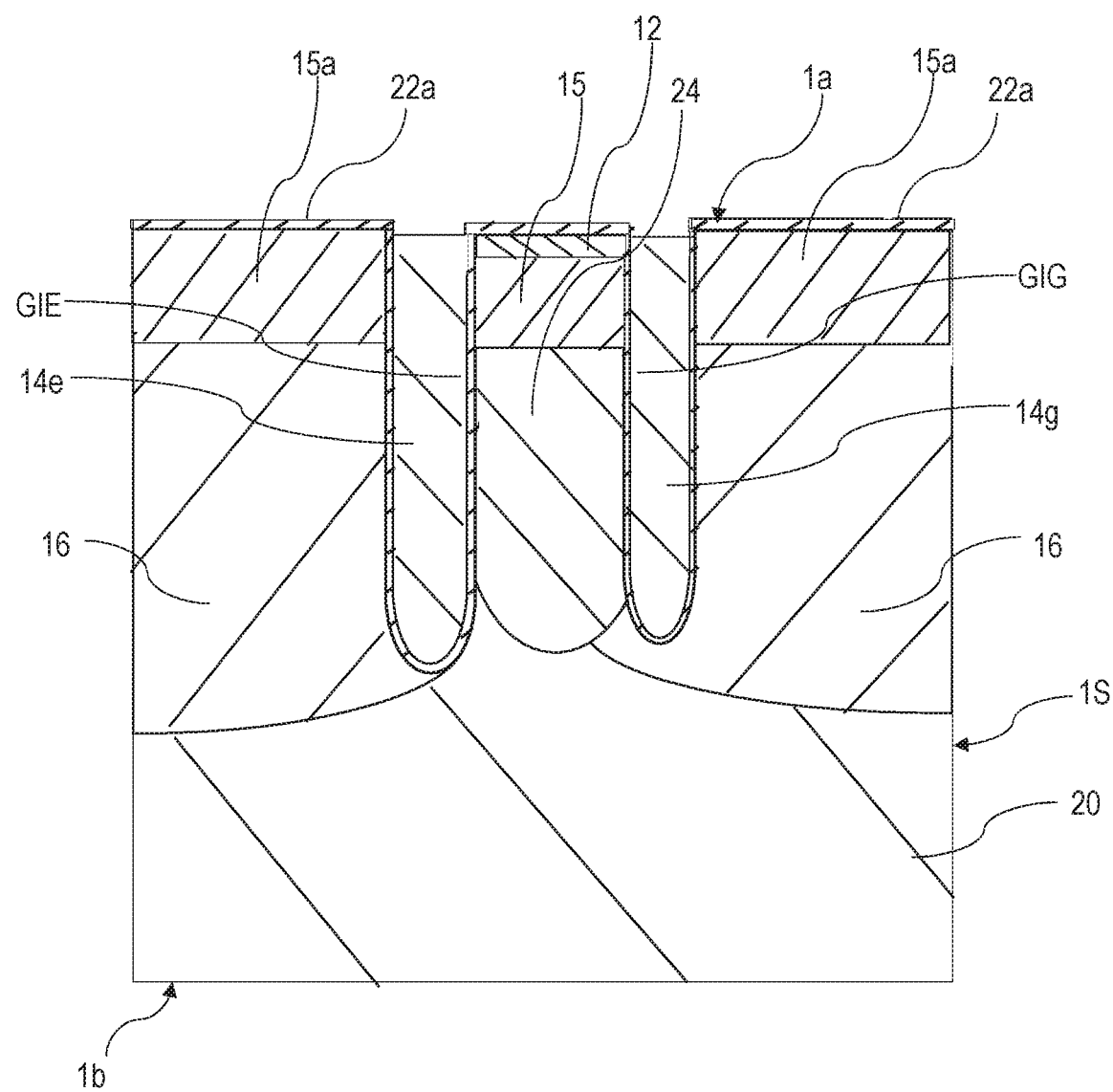
FIG. 9 is a main portion cross-sectional view for explaining the manufacturing method of the semiconductor device according to the one embodiment.

Next, as shown in FIG. 9, the P-type base layer 15 and the P-type base layer 15a are formed by introducing a P-type impurity into the first main surface 1a of the semiconductor substrate 1S by ion implantation using a resist pattern as a mask. As the ion implantation condition, for example, an ion species of boron, a dose of about 3×10 13 of boron, and an implantation energy of about 75 keV can be exemplified as suitable.

The P-type base layer 15 is formed on the surface of the N-type hole barrier layer 24 such that the P-type base layer 15 is in contact with one side surface of the trench gate 14g via gate dielectric film GIGs. The P-type layer 15a is formed on the surface of the P-type floating layer 16 in the same process as the P-type base layer 15.

Next, an N-type impurity is introduced into the surface of the P-type base layer 15 by ion implantation using a resist pattern as a mask, thereby forming the N-type emitter layer 12. As for the ion injection condition, for example, the ion seed is arsenic, the doze is about 5×10 15 cm−2, and about 80 keV of the injection energy can be exemplified as a suitable condition.

Figure 10:
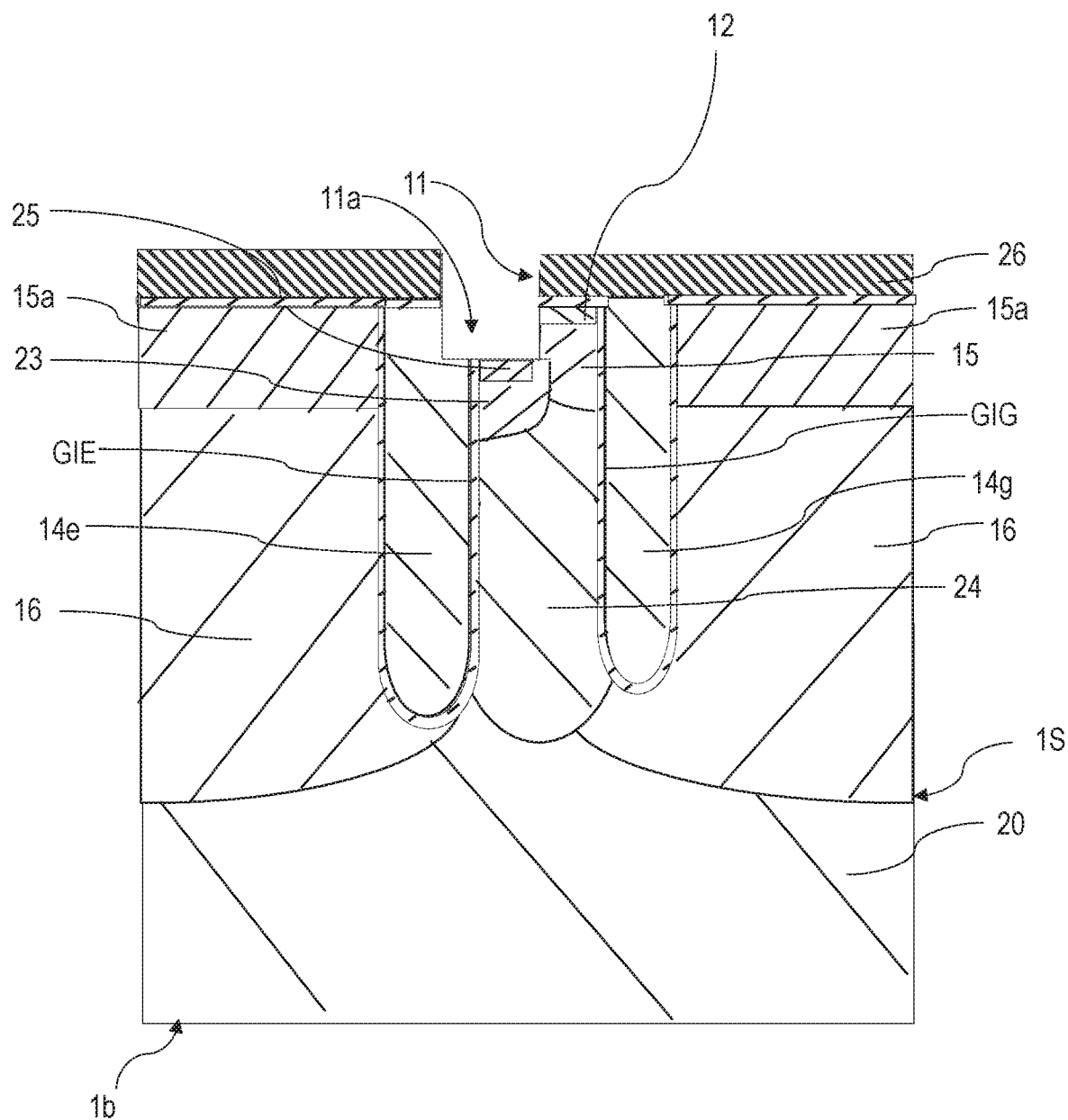
FIG. 10 is a main portion cross-sectional view for explaining the manufacturing method of the semiconductor device according to the one embodiment.

Next, as shown in FIG. 10, an interlayer insulating film 26 made of, for example, a PSG (Phosphorus Silicate Glass) film is formed on the first main surface 1a of the semiconductor substrate 1S by, for example, a CVD method or the like. The thickness of the interlayer insulating film 26 is, for example, about 0.6 μm. As materials of the interlayer insulating film 26, in addition to the PSG film, a BPSG (Boron Phosphorus Silicate Glass film, an NSG (Non-doped Silicate Glass) film, an SOG (Spin On Glass) film, a complex film of these, or the like can be exemplified as suitable materials.

Next, the opening 11 is formed in the interlayer insulating film 26 by anisotropic dry etching using the resist pattern as a mask. As the gas for this anisotropic dry etching, for example, a mixed gas of Ar gas, CHF3 gas, and CF4 gas can be exemplified as a suitable gas. Subsequently, the first main surface 1a of the semiconductor substrate 1S exposed from the opening 11 of the interlayer insulating film 26 is etched by an anisotropic dry etching method, whereby the contact trench 11a reaching the middle of the P-type base layer 15 and the trench emitter 21e is formed.

Next, a P-type latch-up preventing layer 23 is formed by ion implantation of a P-type impurity through the contact trench 11a. As for the ion injection condition, for example, the ion species is boron, the doze is about $1 \times 10^{15}$ or cm−2, and about 100 keV of the injection energy can be exemplified as a suitable condition.

Next, a P-type base contact layer 25 is formed by ion implantation of a P-type impurity through, for example, the contact trench 11a. As for the ion injection condition, for example, the ion species is boron, the doze is about $5 \times 10^{15}$ or cm−2, and about 80 keV of the injection energy can be exemplified as a suitable condition. The P-type impurity concentration in the P-type base contact layer 25 is set higher than the P-type impurity concentration in the P-type latch-up prevention layer 23.

Figure 11:
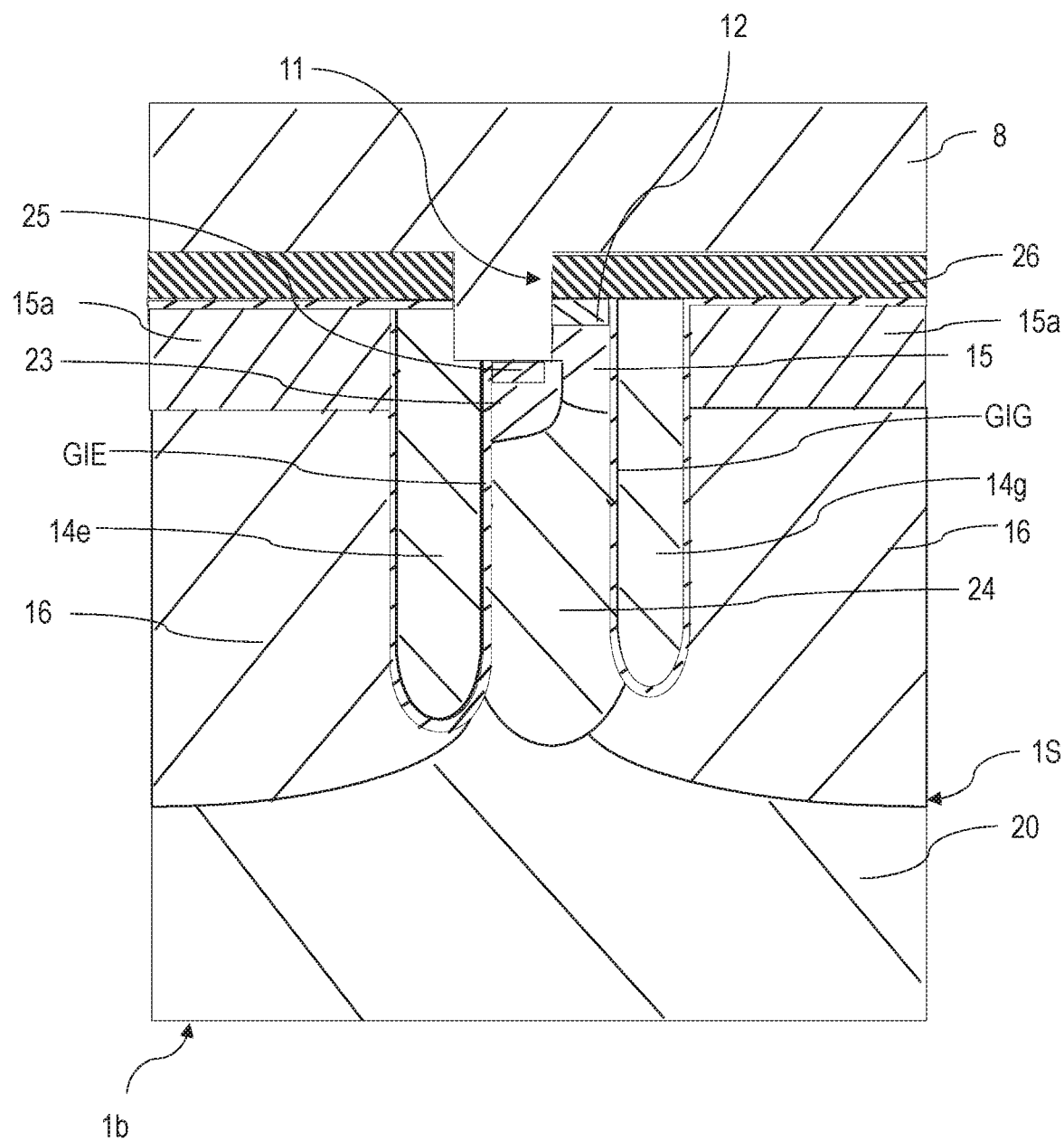
FIG. 11 is a main portion cross-sectional view for explaining the manufacturing method of the semiconductor device according to the one embodiment.

Next, as shown in FIG. 11, the emitter electrode 8 is formed on the interlayer insulating film 26 including the inside of the opening 11 and the contact groove 11a. The emitter electrode 8 is formed as a laminated film by, for example, the following procedure.

First, a titanium-tungsten film is formed as a barrier metal film on the first main surface 1a of the semiconductor substrate 1S by, e.g., a sputtering method. The thickness of the titanium tungsten film is, for example, about 0.2 μm.

Next, after performing silicide annealing at, for example, about 600° C. for about 10 minutes in a nitrogen atmosphere, an aluminum-based metal film is formed on the entire surface of the titanium tungsten film by, for example, a sputtering method so as to bury the inside of the contact trench 11a. The aluminum-based metal film is composed of an aluminum film to which, for example, several percent silicon is added, and has a thickness of about 5 μm.

Next, an emitter electrode 8 composed of a laminated film of a titanium tungsten film and an aluminum-based metal film is formed by processing into a predetermined pattern by a dry etching method using a resist pattern as a mask. As a gas for this dry etching, for example, Cl2/BCl3 gas or the like can be exemplified as a suitable gas.

The emitter electrode 8 is electrically connected to each of the N-type emitter layer 12, the P-type base contact layer 25, the P-type latch-up preventing layer 23, and the trench emitter 14e via the interlayer insulating film 26.

Next, by subjecting the second principal surface 1b of the semiconductor substrate 1S to a back grinding process, the thickness of about 800 μm, which is the initial thickness of the semiconductor substrate 1S, is thinned to, for example, about 30 μm to 200 μm as required. When the withstand voltage of the IE-type IGBT is designed to be, for example, about 600V, it is preferable to set the final thickness of the semiconductor substrate 1S to about 70 micrometers. Also, as required, chemical etching can be performed on the second main surface 1b in order to remove damage in the back grinding process.

Figure 12:
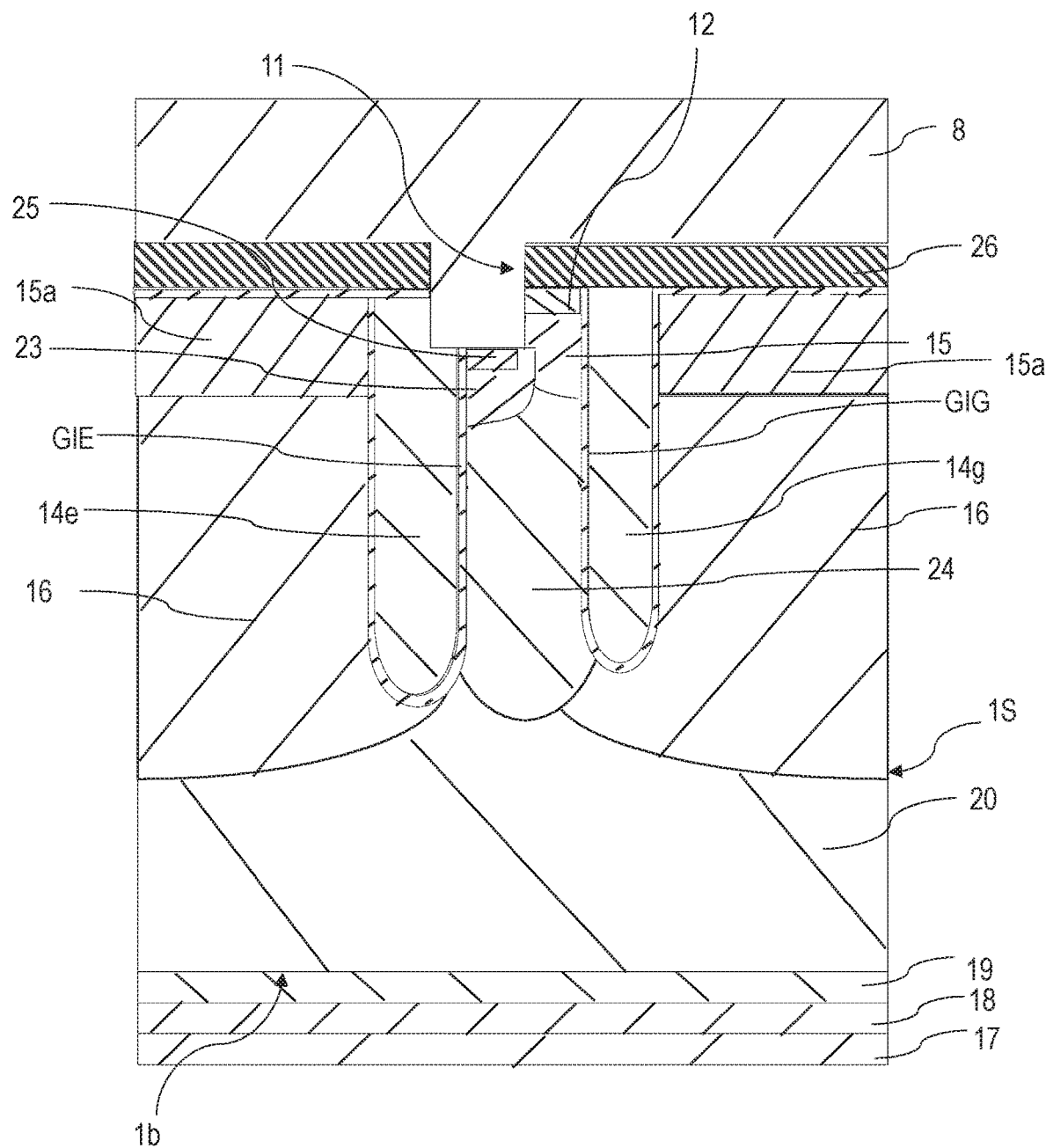
FIG. 12 is a main portion cross-sectional view for explaining the manufacturing method of the semiconductor device according to the one embodiment.

Next, as shown in FIG. 12, N-type impurities are introduced into the second main surface 1b of the thinned semiconductor substrate 1S by, e.g., ion implantation to form N-type buffer layers 19. As the ion implantation condition at this time, for example, an ion species of phosphorus, a dose of about $7 \times 10^{12}$, and an implantation energy of about 350 keV can be exemplified as suitable. Thereafter, as required, laser annealing is performed on the second main surface 1b of the semiconductor substrate 1S for impurity activation.

Next, a P-type impurity is introduced into the main surface 1b of the semiconductor substrate 1S by, e.g., ion implantation to form the P-type collector layer 18. As for the ion injection condition in this case, for example, the ion species is boron, the doze is about $1 \times 10^{13}$ or cm−2, and the injection energy of about 40 keV can be exemplified as a favorable condition. Thereafter, as required, laser annealing is performed on the main surface 1b of the semiconductor substrate 1S in order to activate the impurity.

Next, the collector electrode 17 is formed on the surface of the P-type collector layer 18 by, e.g., sputtering.

By the above processes, the IE-type IGBT shown in FIG. 1 can be manufactured. Here, in order to more specifically exemplify the device structure, an example of main dimensions of each part of the device is shown.

The distance between the trench emitter 14e and the trench gate 14g is about 0.8 μm to 0.9 μm, and the width of the P-type floating layer 16 is about 3.3 μm, each of which is a so-called cell pitch and an inter-cell pitch. The depth of the N-type emitter layer 12 is about 250 nm, the depth of the P-type base layer 15 is about 0.8 μm, the depth of the P-type latch-up preventing layer 23 is about 1.4 μm, and the depth of the P-type floating layer 16 is about 4.5 μm. The thickness of the N-type buffer layer 19 is about 1.5 μm, and the thickness of the P-type collector layer 18 is about 0.5 μm. The thickness of the semiconductor substrate 1S can be changed in accordance with the required withstand voltage. For example, about 120 μm at a withstand voltage of 1200 volts and about 40 μm at a withstand voltage of 400 volts can be exemplified as suitable values.

Figure 14:
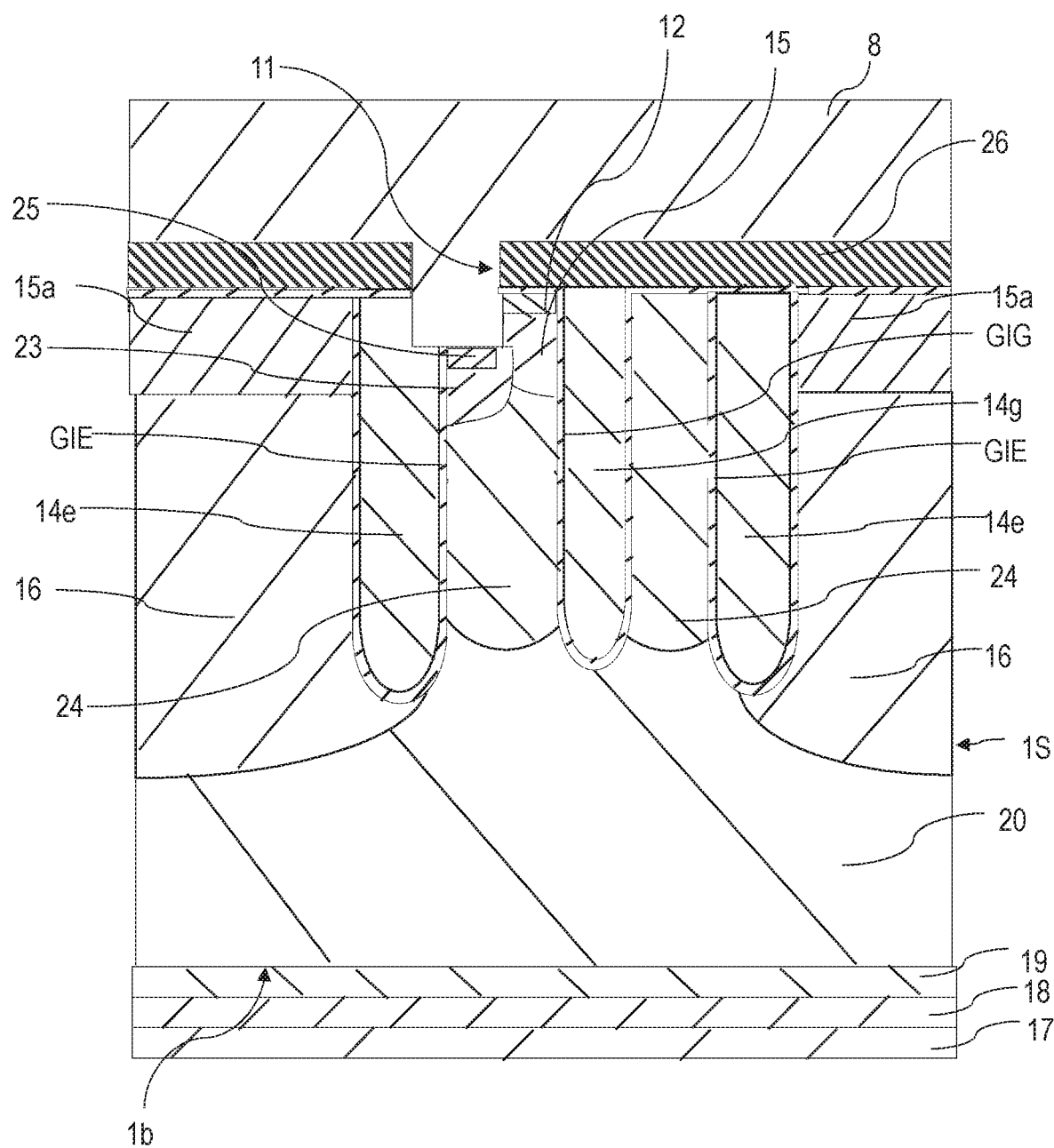
FIG. 14 is a main portion cross-sectional view showing a modified example of the one embodiment shown in FIG. 1.

FIG. 14 is a main portion cross-sectional view showing a configuration of a semiconductor device according to a first modified example of the one embodiment of the present invention.

The first modified example differs from the structure shown in FIG. 1 in that trench emitters 14e are formed so as to sandwich trench gates 14g. The planar shape of the trench emitter 14e is integrally formed so as to surround the trench gate 14g. According to this configuration, the electric field applied to the bottom surface portion of the trench gate 14g can be alleviated as compared with the configuration shown in FIG. 1, and the electrical reliability can be further improved. In addition, since the trench emitter 14e is disposed between the trench gate 14g and the P-type floating layer 16, the potential variation of the trench gate 14g can be further suppressed.

Figure 15:
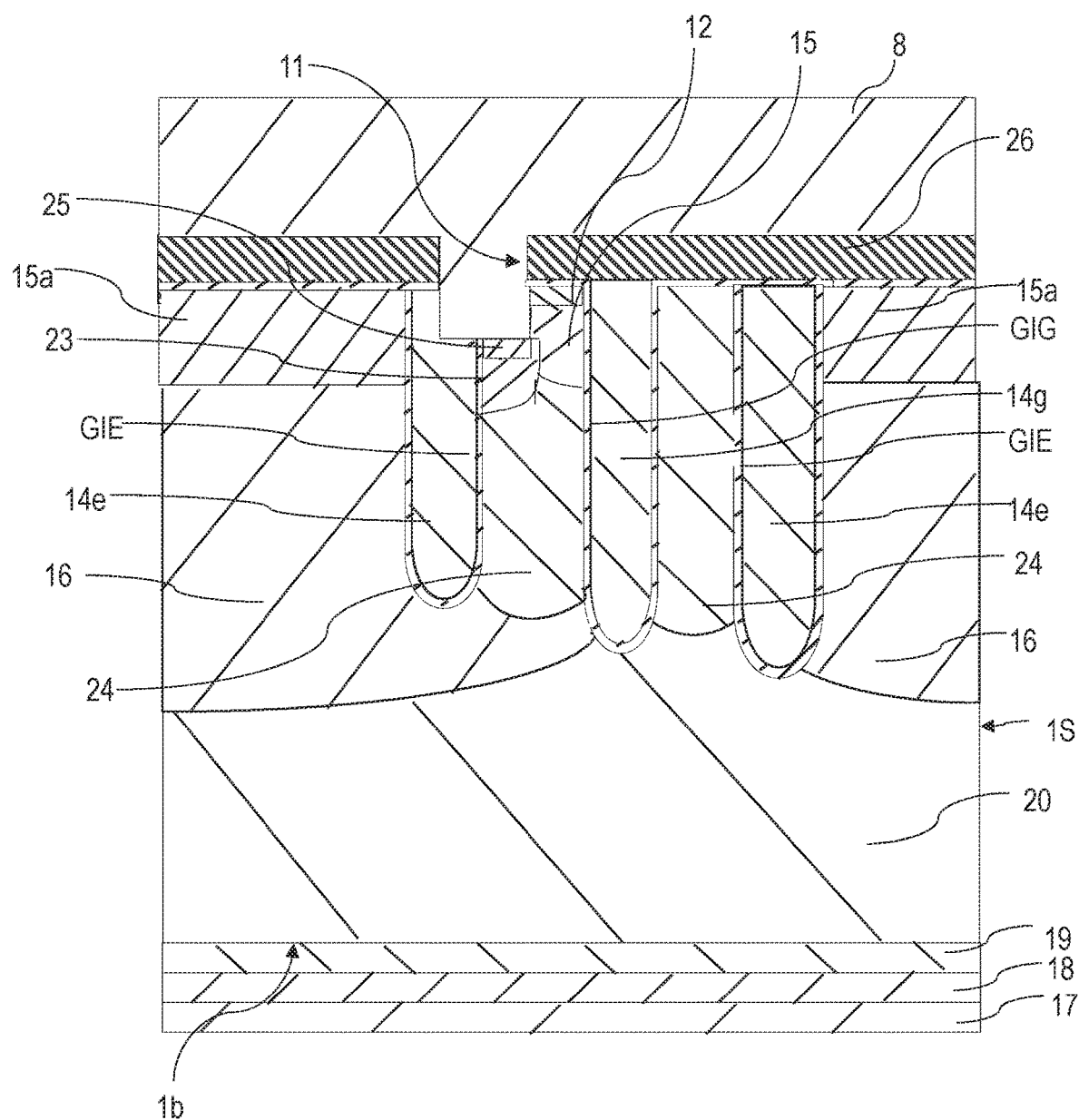
FIG. 15 is a main portion cross-sectional view showing a modified example of the one embodiment shown in FIG. 1.

FIG. 15 is a main portion cross-sectional view showing the configuration of the semiconductor device according to a second modified example of the one embodiment of the present invention.

The second modified example differs from the structure shown in FIG. 1 in that the depth of the trench emitter 14e is formed shallower than the trench gate 14g in the active region, the P-type floating layer 16 under the N-type hole barrier layer 24 is formed so as to cover the bottom surface portion of the trench emitter 14e, and the trench emitter 14e deeper than the depth of the trench gate 14g is formed outside the trench gate 14g in the active region.

According to this configuration, the electric field in the bottom portion of the P-type body layer can be alleviated by the P-type floating layer 16. Since the electric field at the bottom surface of the trench emitter 14e can be relaxed, the concentration of the N-type hole barrier layer 24 can be further increased, and the IE effect can be improved. In addition, since the trench gate 14g is formed deeper than the trench emitter 14e in the active region, there is a concern that the electric field intensity of the bottom surface portion of the trench gate 14g is increased, but by forming the trench emitter 14e deeper than the trench gate 14g outside the trench gate 14g, the electric field of the bottom surface portion of the trench gate 14g can be relaxed.

Features of the configuration described in the second modified example include:

a semiconductor substrate having a first main surface and a second main surface opposite to the first main surface; a stripe-shaped trench gate formed on the first main surface; a stripe-shaped first trench emitter formed on the first main surface and arranged to face the trench gate; an N-type emitter layer and a P-type base layer formed on the first main surface in a region surrounded by the trench gate and the first trench emitter in a plan view; an N-type emitter layer and a P-type base layer formed on the first main surface and arranged on one side of the first trench emitter and arranged on the first main surface and having a higher impurity concentration than the base layer; a P-type base contact layer formed on the first main surface and arranged on the first main surface and arranged to face the first main surface and arranged to face the first trench gate and arranged to face opposite to the first trench emitter; and a P-type base contact layer formed on the first main surface The semiconductor device includes a P-type flooding layer formed on the first main surface outside the trench gate and the second trench emitter, emitter electrodes commonly connected to the P-type base contact layer, the first trench emitter, and the N-type emitter layer, a P-type collector layer formed on the second main surface, and an N-type drift layer formed in the semiconductor substrate between the P-type collector layer and the P-type base layer, wherein the bottom surface portion of the first trench emitter is disposed at a position shallower than the bottom surface portion of the trench gate in the thickness direction of the semiconductor substrate, and the bottom surface portion of the second trench emitter is disposed at a position deeper than the bottom surface portion of the trench gate in the thickness direction of the semiconductor substrate, and the emitter is formed to cover the bottom surface portion of the P-type flooring layer disposed outside the trench gate.

Further, the configuration described in the above second modified example is characterized in that an N-type layer is formed between the P-type base layer and the N-type drift layer in the thickness direction of the semiconductor substrate and has a higher impurity concentration than the N-type drift layer, and the P-type flooding layer is formed so as to cover the bottom surface portion of the N-type layer having the high impurity concentration.

As described above, in the semiconductor device according to the present embodiment, since the trench gates and the trench emitters are arranged so as to face each other, the IE effect of the IE type IGBT can be improved. Further, since the depth of the trench emitters 14e is formed deeper than the depth of the trench gates 14g, the electric reliability of the semiconductor device can be improved.

The invention made by the present inventor has been described above in detail on the basis of the embodiments. However, the present invention is not limited to the embodiments described above, and various modifications can be made without departing from the gist thereof.

For example, the semiconductor substrate 1S may be a substrate in which an N-type epitaxial layer having a low impurity concentration is formed on an N-type semiconductor substrate layer having a high impurity concentration.

What is claimed is:

1. A semiconductor device comprising:
a semiconductor substrate having a first major surface and a second major surface on the opposite side of the first major surface;
a stripe-shaped trench gate formed on the first major surface;
a stripe-shaped trench emitter formed on the first major surface and arranged to face the trench gate;
an N-type emitter layer and a P-type base layer formed on the first major surface of a region surrounded by the trench gate and the trench emitter in plan view and arranged at one side of the trench gate;
a P-type base contact layer formed on the first major surface and arranged at one side of the trench emitter, the P-type base contact layer having a higher impurity concentration than the base layer;
a P-type floating layer formed on the first major surface at the outside of the trench gate and the trench emitter in plan view, the P-type floating layer being positioned at the other sides of the trench gate and the trench emitter respectively;
an emitter electrode formed to commonly connect with the P-type base contact layer, the trench emitter, and the N-type emitter layer;
a P-type collector layer formed on the second major surface; and
an N-type drift layer formed in the semiconductor substrate between the P-type collector layer and the P-type base layer,
wherein a bottom surface of the trench emitter is closer to the P-type collector layer than a bottom surface of the trench gate in a thickness direction of the semiconductor substrate,
wherein the P-type floating layer covers a bottom surface of the trench gate and a bottom surface of the trench emitter, and
wherein a thickness of a portion of the P-type floating layer extending from the bottom surface of the trench gate towards the P-type collector layer in the thickness direction of the semiconductor substrate is thicker than wherein a thickness of a portion of the P-type floating layer extending from the bottom surface of the trench emitter towards the P-type collector layer in the thickness direction of the semiconductor substrate.

2. The semiconductor device according to claim 1, wherein a depth of the trench emitter is greater than a depth of the trench gate in the thickness direction of the semiconductor substrate.

3. The semiconductor device according to claim 1, wherein the emitter electrode is commonly connected to the N-type emitter layer and the P-type base layer.

4. The semiconductor device according to claim 1,
wherein, in the thickness direction of the semiconductor substrate, an N-type layer is formed between the P-type base layer and the N-type drift layer, and
wherein the N-type layer has a higher impurity concentration than the N-type drift layer.

* * * * *